United States Patent [19]

Grecksch et al.

[11] Patent Number: 4,806,808

[45] Date of Patent: Feb. 21, 1989

[54] PRINTED CIRCUIT BOARD FOR EXTERNAL ROTOR MOTOR WITH RECESS FOR HALL TRANSDUCERS

[75] Inventors: Ernst Grecksch, Estenfeld; Helmut Schmidt, Reichenberg, both of Fed. Rep. of Germany

[73] Assignee: Siemens Aktiengesellschaft, Berlin and Munich, Fed. Rep. of Germany

[21] Appl. No.: 96,164

[22] Filed: Sep. 11, 1987

[30] Foreign Application Priority Data

Sep. 12, 1986 [DE] Fed. Rep. of Germany ....... 3631106

[51] Int. Cl.$^4$ ...................... H02K 29/08; H02K 3/26; H02K 5/22
[52] U.S. Cl. .................................. 310/71; 310/67 R; 310/DIG. 6; 361/401
[58] Field of Search ................... 310/67 R, 68, 71, 89, 310/40 MM, 268; 318/254; 361/400, 401, 405

[56] References Cited

U.S. PATENT DOCUMENTS

| | | | |
|---|---|---|---|
| 4,093,897 | 6/1978 | Fujita et al. | 310/268 |
| 4,143,508 | 3/1979 | Ohno | 361/401 |
| 4,259,603 | 3/1981 | Uchiyama et al. | 310/67 R |
| 4,719,384 | 1/1988 | Hauden et al. | 361/401 |
| 4,724,346 | 2/1988 | Klein et al. | 310/71 |
| 4,730,136 | 3/1988 | Müller | 318/254 |

FOREIGN PATENT DOCUMENTS

| | | |
|---|---|---|
| 0152508 | 8/1985 | European Pat. Off. |
| 8527157 | 8/1986 | Fed. Rep. of Germany |
| 85/2515 | 6/1985 | PCT Int'l Appl. ............. 361/400 |

OTHER PUBLICATIONS

Patent Abstracts of Japan, vol. 7, No. 76, Mar. 30, 1983.

*Primary Examiner*—Patrick R. Salce
*Assistant Examiner*—D. L. Rebsch
*Attorney, Agent, or Firm*—Kenyon & Kenyon

[57] ABSTRACT

In order to be able to decrease the axial height, while simultaneously simplifying the manufacture, and also increasing the operational safety of printed circuit boards with electrical structural elements, such as Hall transducers affixed and electrically contacted to it further:

(a) the printed circuit board contains, at least on one side, a supporting board (2) with recesses (21-23) in the area of each Hall transducer (4; 5; 6) and its connection legs (41-43; 51-53; 61-63) and on the other side a conductive foil (3) fastened to the surface of the supporting board (2), which covers the recesses (21-23) at least in the area of the free ends of the connection legs (41-43; 51-53; 61-63) and lands (44-46; 54-56; 64-66) for the connection legs of the Hall transducers; and (b) each Hall transducer and its connection legs is placed in a recess and the connection legs extend within the recess and include angle-bent ends connected to the lands.

7 Claims, 1 Drawing Sheet

PRINTED CIRCUIT BOARD FOR EXTERNAL ROTOR MOTOR WITH RECESS FOR HALL TRANSDUCERS

BACKGROUND AND SUMMARY OF THE INVENTION

The invention relates to a printed circuit board and, more particularly, to a printed circuit board mounted on the stator of an external rotor motor and arranged to hold Hall transducers at close frontal axial distances from the rotor magnets.

As known from the disclosure of DE-GM No. 85 27 157, a printed circuit board is fastened on the stator of an external rotor motor, and Hall transducers are arranged on the printed circuit board within narrow axial distances to the front faces of the rotor magnets. In this manner, when the magnets are rotated, position-dependent and speed-dependent signal voltages are generated in the Hall transducers, which are supplied, for example to a succeeding motor control. The Hall transducers are supported by being partially sunk into recesses of the circuit board which is printed with conductor paths. The connection pins projecting from one of the front faces of the Hall transducers extend initially above and parallel to one of the surfaces of the printed board, and include angle-bent ends which are subsequently guided through connection pin single bores of the circuit board and placed on the other circuit board surface which is provided with the printed conducting paths. The angle-bent ends are guided into lands and are contacted electrically to the conducting paths via the lands by soldering.

The EP-PA No. 152 508 discloses an axial flow motor (Pancake Motor) in which the entire stator winding is arranged between the rotor magnets and the Hall transducers. The Hall transducers are either arranged in a recess of a printed circuit board supporting board with switching legs extending above it or in a recess of the stator yoke with switching legs extending initially axially from the Hall transducers and subsequently radially supported.

According to the primary objective of the present invention, the axial height of the printed circuit board with the electric structural elements attached to it is intended to be reduced, in particular with a view to a possible reduction of the axial distance between the front faces of the rotor magnets and the opposing surface of the circuit board with the attached Hall transducers to be acted upon by the rotor magnets, while simultaneously simplifying manufacture and increasing operating safety.

The objective is achieved with a printed circuit board wherein recesses are formed on one surface of the board and are arranged and configured to receive the Hall transducers and their connecting legs. In this manner, the connecting legs of each transducer extend substantially within a recess rather than above and parallel to the printed circuit board surface. Moreover, a conductive foil arrangement is provided on the opposite side of the printed circuit board to provide conducting paths for the Hall transducers to connect the Hall transducers to other control circuitry. Connecting lands are provided adjacent the recesses to receive angle-bent ends of the Hall transducer connecting legs for electrical connection to the conductive foil.

The construction according to the invention of a printed circuit board permits, on the one hand, complete sinking of the structural elements, in particular the Hall transducers and their connecting legs, into the recesses of the supporting board to reduce the axial height of the printed circuit board, and, on the other hand, the simple, straightforward and space-saving installation of the connection legs of the Hall transducers in the region of the recesses of the supporting board, with their electrical connection to the conductive foil being made possible by merely simply up-bending of the free ends and the simple insertion of these ends into the lands of the conductive foil covering the corresponding recess in the supporting board.

If, according to one embodiment of the invention, the conductive foil is also recessed in the areas of the actual Hall transducers, it too can be sunk into the axial depth of the conductive foil with a view toward further decreasing the axial construction height of the printed circuit board. The conductive foil is best fastened onto the surface of the carrier foil with bonding agents and developed as flexible conductive foil, with, according to a further design of the invention, the flexible conductive foil in one piece changing into an outer conductive foil ribbon, which contains the outer lead-ins and/or lead-outs of the conductive foil.

The invention, as well as further advantageous features of the invention, are explained below in greater detail in conjunction with an embodiment schematically represented in the drawing, in which:

DETAILED DESCRIPTION

Figure 1:
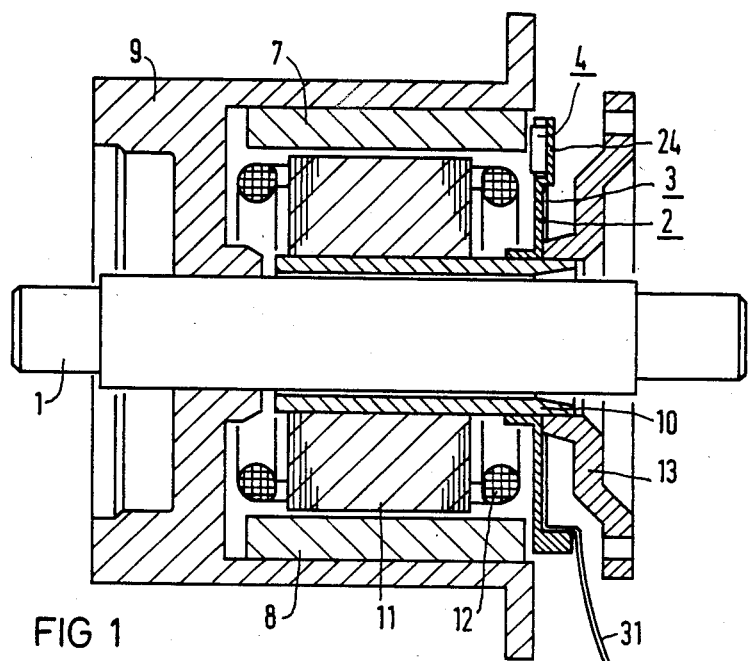
FIG. 1 is an axial longitudinal section through an external rotor motor provided for driving a disk spindle of a memory disk drive.

FIG. 1 shows an external rotor motor in axially longitudinal section, which drives a spindle 9 firmly connected at the left end with a rotor shaft 1 of a memory disk. The rotor shaft 1 is, in a manner not further shown here, pivoted on both sides and, between these bearings, surrounded by an internal sleeve 10, onto the bearing periphery of which is mounted a stator laminate packet 11. A stator winding 12 is pressed onto the stator laminate packet 11. The right end of the internal sleeve 10 is received by a fastening flange 13, with which the entire memory disk drive is held within an electronic data processing unit. At the inner circumferential face of the disk spindle formed as a rotor bell of the external rotor motor, rotor magnets are arranged radially opposing the stator laminate packet 11, of which in FIG. 1 two rotor magnets 7, 8 can be seen in section.

Figure 3:
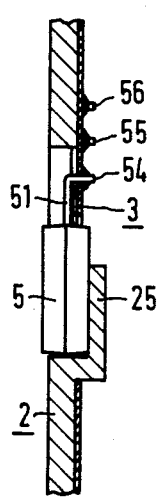
FIG. 3 illustrates a partial section through the printed circuit board according to FIG. 2 in the region of a Hall transducer supported and contacted according to the invention.
Figure 2:
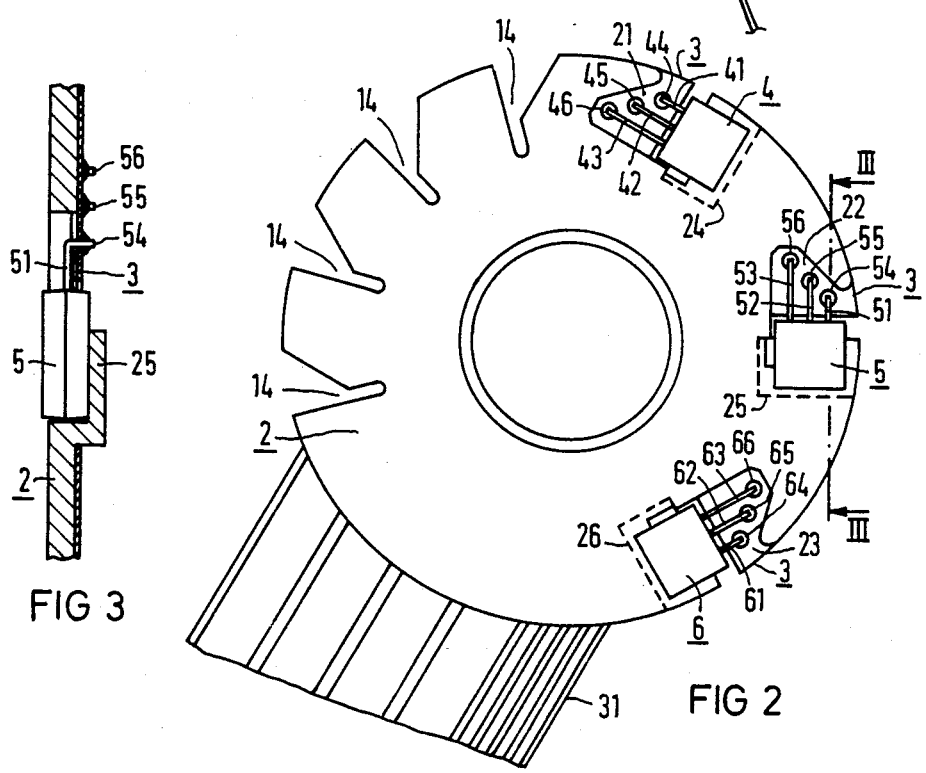
FIG. 2 illustrates a pre-fabricated printed circuit board already equipped with active and passive electrical structural parts and connected to an external flat ribbon cable before its stator end face motor installation.

On the right end of the internal sleeve 10 a supporting board 2, represented in detail in FIGS. 2, 3, is fastened, which extends radially up to the right free front faces of the rotor magnets 7, 8. On the out-lying front face of the supporting board 2, a flexible conductive foil 3 is fastened with an external conductive foil ribbon 31, which contains the outer lead-ins and lead-outs of the conductive foil 3. The conductive foil 3 may be arranged within a recess formed in each of the areas of the supporting board 2 adjacent to the Hall transducers 4, 5, 6.

The supporting board 2 is provided over its circumference with recesses 21-23 for receiving and holding Hall transducers 4-6 in such a way that the Hall transducers 4-6 can be arranged with the least possible axial distance to the right free front faces of the rotor magnets 7, 8.

The connection legs 41-43, 51-53, and 61-63 of the Hall transducers 4, 5, and 6 extend in the recesses 21-23 of the supporting board 2 initially unbent in the longitudinal direction of the supporting board 2 up to its single angle-bent free end opposite corresponding lands 44-46, 54-56, and 64-66 of the conductive foil 3 which covers the recesses 21-23 of the supporting board 2 in this area. The angle-bent, pushed through ends of the connection legs 41-43, 51-53, and 61-63 are electrically contacted in the usual way through soldering points with the lands.

Radial slots 14 are provided at the circumference of the printed circuit board, and are, along the edge, widened into a funnel shape. The radial slots 14 serve in a manner, not shown here, for advantageously threading in and through winding ends of the stator winding 12 from the stator winding side of the backside of the printed circuit board to its front side which is provided with lands for the stator winding ends.

As an external protective covering for the Hall transducers 4, 5, 6 which are fixed in the recesses 21, 22, 23 of the supporting board 2, are cover caps 24-26. The cover caps 24-26 are integrally formed on the board 2 and cover the Hall transducers 4-6 on their underside facing away axially from the rotor magnets 7, 8.

The top side of each of the Hall transducers 4-6 - because of the structure of the printed circuit board according to the invention, and the configuration and contacting of the Hall transducers in the recesses 21, 22, 23 of the supporting board 2 - extends coplanar to the upper side of the supporting board 2 facing the front faces of the rotor magnets 7, 8, so that the Hall transducers 4-6 can be placed with the least amount of axial distance to the opposing front faces of the rotor magnets 7, 8.

What is claimed is:

1. In a printed circuit board mounted on the stator of a radial flow external rotor motor including Hall transducers held in recesses formed on one surface of the printed circuit board at close frontal axial distances to the rotor magnets of the external rotor motor and contacting conductor paths, each of said Hall transducers having corresponding connection legs, an improvement, which comprises:
   (a) said printed circuit board including at least one supporting board having a recess in the region of each of said Hall transducers and the corresponding connection legs;
   (b) a conductive foil fastened to the surface of the supporting board; said conductive foil being arranged to cover each recess;
   (c) a plurality of lands for the electrical connection of said connection legs to said conductive foil; and
   (d) each of said Hall transducers and the corresponding connection legs being arranged in one of said recesses; said corresponding connection legs extending within said one of said recesses to reduce the axial height of the printed circuit board and including angle-bent ends connected to said lands.

2. The printed circuit board of claim 1, wherein said conductive foil is arranged within a recess in each of the areas adjacent to said Hall transducers.

3. The printed circuit board of claim 1 and further a plurality of cover caps arranged to cover and protect the undersides of said Hall transducers.

4. The printed circuit board of claim 3, wherein said cover caps are integrally formed with said supporting board.

5. The printed circuit board of any one of claims 1 to 4, wherein said conductive foil is affixed with a bonding agent to the surface of said supporting board.

6. The printed circuit board of any one of claims 1 to 4, wherein said conductive foil comprises a flexible bonding sheet having conductor paths.

7. The printed circuit board of any one of claims 1 to 4, wherein said conducting foil is coupled to an outer conductive foil ribbon.

* * * * *